United States Patent
Lee

(10) Patent No.: US 12,158,503 B2
(45) Date of Patent: Dec. 3, 2024

(54) SIGNAL PROCESSING APPARATUS

(71) Applicant: HYUNDAI AUTOEVER CORP., Seoul (KR)

(72) Inventor: Bong-Gu Lee, Seoul (KR)

(73) Assignee: HYUNDAI AUTOEVER CORP., Seoul (KR)

( * ) Notice: Subject to any disclaimer, the term of this patent is extended or adjusted under 35 U.S.C. 154(b) by 177 days.

(21) Appl. No.: 18/080,232

(22) Filed: Dec. 13, 2022

(65) Prior Publication Data

US 2023/0194611 A1 Jun. 22, 2023

(30) Foreign Application Priority Data

Dec. 16, 2021 (KR) .................. 10-2021-0180414

(51) Int. Cl.
*G01R 31/34* (2020.01)
*G01R 31/317* (2006.01)

(52) U.S. Cl.
CPC ..... *G01R 31/343* (2013.01); *G01R 31/31706* (2013.01)

(58) Field of Classification Search
None
See application file for complete search history.

(56) References Cited

U.S. PATENT DOCUMENTS 6,850,252 B1 * 2/2005 Hoffberg ............. H04N 21/475
380/252

FOREIGN PATENT DOCUMENTS

| KR | 100741863 B1 * | 7/2007 | ............ G08B 13/19 |
| KR | 20200053772 A | 5/2020 | |
| WO | WO-2014103187 A1 * | 7/2014 | ............ G01S 13/56 |

OTHER PUBLICATIONS

English translation of KR 100741863 B1 (Year: 2007).*
English Translation of WO 2014/103187 A1 (Year: 2014).*

* cited by examiner

Primary Examiner — Jermele M Hollington
(74) Attorney, Agent, or Firm — Lempia Summerfield Katz LLC

(57) ABSTRACT

A signal processing apparatus detects a phase difference between two signals by applying the Lissajous figure and compensates for an error between the signals by recognizing a pattern, thereby easily detecting the phase difference between the signals.

10 Claims, 17 Drawing Sheets

SIGNAL PROCESSING APPARATUS

CROSS-REFERENCE TO RELATED APPLICATION

This application claims priority to and the benefit of Korean Patent Application No. 10-2021-0180414, filed on Dec. 16, 2021, the entire contents of which are incorporated hereby by reference.

FIELD OF TECHNOLOGY

The present disclosure relates to a signal processing apparatus that detects an error between a plurality of signals having phase differences and compensates for the error.

BACKGROUND

An electric vehicle is typically provided with a battery. The electric vehicle charges the battery by supplying a charging current to the battery and operates by receiving operating power from the battery.

In general, the electric vehicle uses a permanent magnet synchronous motor (PMSM) and requires a position sensor such as a resolver sensor to operate the motor.

The resolver sensor detects an angle of a rotor of the motor. Because a stator is configured as an inductor, there is a problem in that when an excitation signal having a sine wave of several kilohertz is applied as an input signal, there occurs a delay between the excitation signal and two output signals, and the two output signals change in magnitudes and phases.

The performance of a motor output signal, as well as the resolver sensor, may be degraded by the phase change of the signal.

The foregoing is intended merely to aid in the understanding of the background of the present disclosure, and is not intended to mean that the present disclosure falls within the purview of the related art that is already known to those having ordinary skill in the art.

SUMMARY

The present disclosure provides a signal processing apparatus that detects an error by using a phase difference between two inputted signals and compensates for the error, thereby improving performance of controlling a resolver sensor or a motor.

In an embodiment of the present disclosure, a signal processing apparatus includes: a signal input unit configured to receive and digitize two signals having a phase difference; a filter unit configured to filter two digitized signals and output filtered first and second signals; a pattern recognition unit configured to convert the filtered first and second signals into coordinates and create a signal trajectory having a predetermined shape; a signal processing unit configured to create a converted sensor signal by normalizing the signal trajectory, calculate an error by comparing the converted sensor signal and a reference signal, and detect abnormality of the filtered first and second signals; a signal compensation unit configured to compensate for the filtered first and second signals on the basis of the error between the converted sensor signal and the reference signal when abnormality is detected; and a control unit configured to verify whether the filtered first and second signals are normally compensated by providing the filtered first and second signals, which are compensated by the signal compensation unit, to the pattern recognition unit and the signal processing unit. In particular, the control unit is configured to calculate an angular velocity based on the compensated first and second signals and a verification result.

The filter unit may include a high pass filter and a low pass filter, the high pass filter and the low pass filter may be connected in series or in parallel to constitute a notch filter or a band pass filter, remove noise of each of the two digitized signals, and separate each of the two digitized signal in a particular frequency region.

The signal processing unit may retrieve a reference signal having a phase difference identical to a phase difference between the filtered first and second signals and compare the reference signal with the filtered first and second signals.

The signal processing unit may normalize the signal trajectory, created by the pattern recognition unit, so that a ratio between signal magnitudes of the filtered first and second signals is 1:1.

The signal processing unit may perform normalization to exclude a change caused by signal magnitudes of the filtered first and second signals and compare a change caused by the phase difference.

The signal processing unit may determine that the filtered first and second signals are normal when a result of comparing the reference signal and the converted sensor signal indicates that an error between the reference signal and the converted sensor signal is 0, and the signal processing unit may determine that the filtered first and second signals are abnormal when the error therebetween is not 0.

The pattern recognition unit may convert a signal value of the filtered first signal into an X-axis coordinate, convert a signal value of the filtered second signal into a Y-axis coordinate, and create the signal trajectory that connects the X-axis coordinate and the Y-axis coordinate.

The pattern recognition unit may create the signal trajectory on the basis of the Lissajous figure and recognize the signal trajectory as a pattern.

When the compensated first and second signals are inputted, the pattern recognition unit may create a signal trajectory based on the compensated first and second signals, and the signal processing unit may verify the compensated signal by calculating an error by comparing the signal trajectory, created based on the compensated first and second signals, with the reference signal again.

When the error is 0, the control unit may calculate the angular velocity from the filtered first and second signals without verifying the signal, and when the error is not 0, the control unit may allow the signal compensation unit to compensate for the error.

According to an aspect, the signal processing apparatus of the present disclosure may compensate for an error between two signals having a phase difference by using the Lissajous figure and may verify the compensated signal, thereby improving the accuracy of the signal.

According to an aspect, the signal processing apparatus may be utilized with a process of processing various signals, such as a process of controlling the resolver sensor or the motor, improve the control efficiency, and improve the performance of the apparatus.

BRIEF DESCRIPTION OF THE DRAWINGS

In order that the disclosure may be well understood, there will now be described various forms thereof, given by way of example, reference being made to the accompanying drawings, in which.

Figure 1:
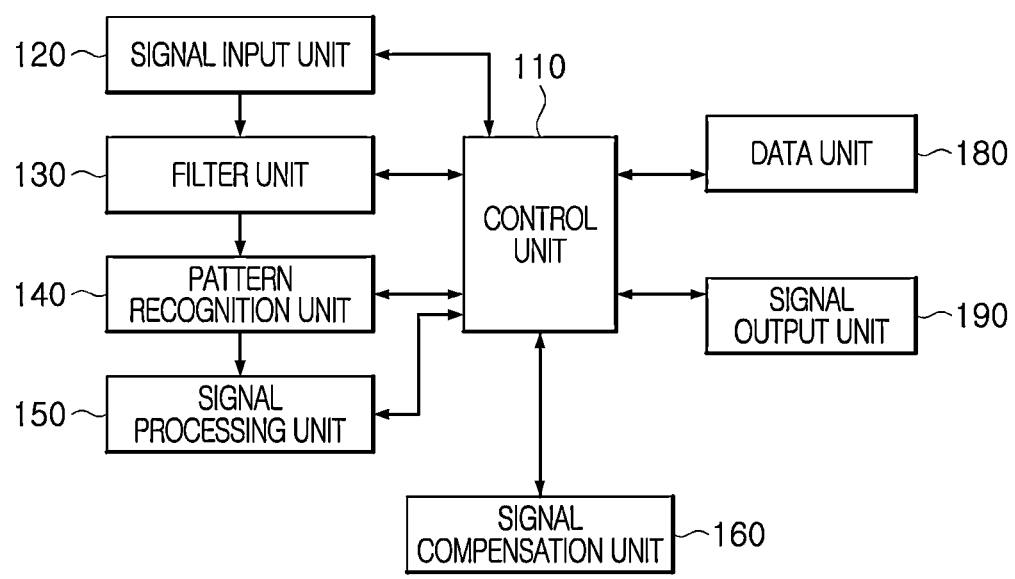
FIG. 1 is a view illustrating a configuration of a signal processing apparatus according to an embodiment of the present disclosure.

It should be understood that the drawings are not necessarily to scale, presenting a somewhat simplified representation of various features illustrative of the basic principles of the disclosure. The specific design features of the present disclosure, including, for example, specific dimensions, orientations, locations, and shapes can be determined in part by the particular intended application and use environment.

In the figures, reference numerals refer to the same or equivalent parts of the present disclosure throughout the several figures of the drawing.

DETAILED DESCRIPTION

Hereinafter, embodiments of the present disclosure are described in detail with reference to the accompanying drawings. In the drawings, the thicknesses of lines, sizes of constituent elements, or the like, may be exaggerated for clarity and convenience of description. In addition, the terms used below are defined in consideration of the functions thereof in the present disclosure and may vary depending on the intention of a user or an operator or a usual practice. Therefore, such terms should be defined based on the entire contents of the present specification.

Throughout the specification, when a certain part "includes" or "comprises" a certain component, this indicates that other components are not excluded, and may be further included unless otherwise noted. The same reference numerals used throughout the specification refer to the same constituent elements.

When a component, device, element, or the like of the present disclosure is described as having a purpose or performing an operation, function, or the like, the component, device, or element should be considered herein as being "configured to" meet that purpose or to perform that operation or function.

As publicly known in the art, some of exemplary forms may be illustrated in the accompanying drawings from the viewpoint of function blocks, units and/or modules. Those having ordinary skill in the art should understand that such blocks, units and/or modules are physically implemented by electronic (or optical) circuits such as logic circuits, discrete components, processors, hard wired circuits, memory devices and wiring connections. When the blocks, units and or modules are implemented by processors or other similar hardware, the blocks, units and modules may be programmed and controlled through software (for example, codes) in order to perform various functions discussed in the present disclosure. Furthermore, each of the blocks, units and/or modules may be implemented by dedicated hardware or a combination of dedicated hardware for performing some functions and a processor for performing another function (for example, one or more programmed processors and related circuits).

FIG. 1 is a block diagram illustrating a configuration of a signal processing apparatus, according to an embodiment of the present disclosure.

As illustrated in FIG. 1, the signal processing apparatus includes: a signal input unit 120, a filter unit 130, a pattern recognition unit 140, a signal processing unit 150, a signal compensation unit 160, a signal output unit 190, a data unit 180, and a control unit 110.

The signal input unit 120 may be configured to receive two signals having a phase difference and convert an analog signal into a digital signal. For example, the signal input unit 120 may receive a signal detected from a sensor such as a resolver sensor and convert the signal into a digital signal.

The signal input unit 120 may include a plurality of input terminals and an analog-to-digital converter (ADC).

The filter unit 130 may be configured to remove noise by filtering two signals having a phase difference, and separate a signal in a frequency region to be subsequently used. The filter unit 130 may store the separated signal in the data unit 180.

In an example, the filter unit 130 includes a high pass filter and a low pass filter. The high pass filter and a low pass filter may be connected in series or in parallel to constitute a band pass filter or a notch filter.

The pattern recognition unit 140 may be configured to create a trajectory of the signal on the basis of the Lissajous figure of the two filtered signals having a phase difference. The pattern recognition unit 140 may recognize a shape of the created trajectory of the signal as a pattern.

The signal processing unit 150 may be configured to create a normalized and converted sensor signal for signal comparison to the pattern created by the pattern recognition unit 140 based on the Lissajous figure, i.e., the trajectory of the signal.

The signal processing unit 150 may be configured to create a reference signal, to be used as a criterion in signal processing, and store the reference signal in the data unit 180. The signal processing unit 150 may create the reference signal based on the Lissajous figure of two signals having signal magnitudes with a particular integer ratio and having a designated phase difference. The signal processing unit 150 may create a plurality of reference signals according to the phase difference and store the plurality of reference signals in the data unit 180.

The signal processing unit 150 may be configured to retrieve a reference signal, which corresponds to the phase difference between the sensor signals, from the data unit 180 and perform signal processing.

The signal processing unit 150 may compare the converted sensor signal with the reference signal and calculate an error between the reference signal and the converted sensor signal.

When the reference signal is equal to the converted sensor signal, the signal processing unit 150 may calculate an error as 0 and may determine that the two filtered signals are normal. On the other hand, when the error is not 0, the signal processing unit 150 may determine that the two filtered signals are abnormal.

In an example, the pattern recognition unit 140 and the signal processing unit 150 may verify whether a phase difference between the two compensated signals is normal on the basis of the Lissajous figure of the signals compensated by the signal compensation unit 160.

The signal compensation unit 160 may be configured to compensate for the error between the converted sensor signal and the reference signal output by the signal processing unit 150. The signal compensation unit 160 may perform proportional integral (PI) control on the two filtered signals until the error decreases.

The signal output unit 190 may be configured to output a signal compensated by the signal compensation unit 160 and an angular velocity calculated by the control unit 110.

The control unit 110 may be configured to control the input and output of the signal and store data, created for each step, in the data unit 180. In an aspect, the control unit 110 may detect and store an offset value of the converted signal.

On the basis of a result of a signal comparison, performed by the signal processing unit 150, between the reference signal and the converted sensor signal, the control unit 110 may calculate an angular velocity from the two filtered signals without performing separate verification when the error between the converted sensor signal and the reference signal is 0 because the converted sensor signal and the reference signal are equal to each other.

When the error calculated by the signal processing unit 150 is not 0, i.e., the converted sensor signal and the reference signal are different from each other, the control unit 110 may allow the signal compensation unit 160 to compensate for the error. In addition, the control unit 110 may provide the compensated signal to the pattern recognition unit 140 and the signal processing unit 150 and may perform control to verify the compensated signal.

When the signal is normally compensated on the basis of a verification result, the control unit 110 may calculate the angular velocity on the basis of the compensated signal and may output the angular velocity.

Figure 2:
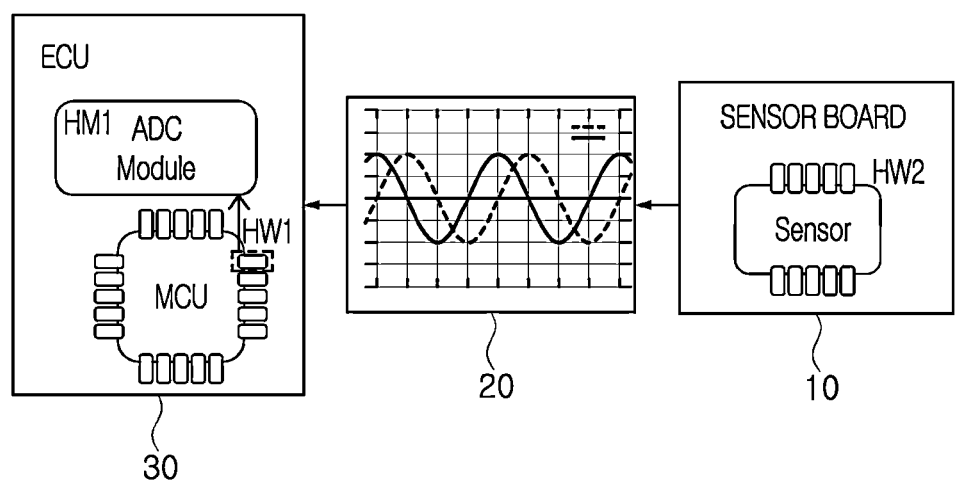
FIG. 2 is a view illustrating a hardware configuration of the signal processing apparatus according to the embodiment of the present disclosure.

FIG. 2 is a block diagram illustrating a hardware configuration of the signal processing apparatus of FIG. 1, according to an embodiment.

As illustrated in FIG. 2, two signals 20, which are different from each other in phase, are outputted from a sensor board on which a sensor 10 is installed, and the two signals 20 are inputted into a signal processing apparatus (electric control unit (ECU)) 30. In an example, the sensor may be a resolver sensor and may be used with a sensor or device that uses a phase difference.

The signal processing apparatus (ECU) 30 may include an analog-to-digital converter (ADC) and a main control unit (MCU).

The ADC may be included in the signal input unit 120, and the MCU may include the signal processing unit 150 and the control unit 110.

The signal processing apparatus 30 may consistently monitor the signal by using a signal HW2 having a phase difference and a signal HW1 generated by feedback, and may compensate for an error with respect to the phase difference.

Figure 3:
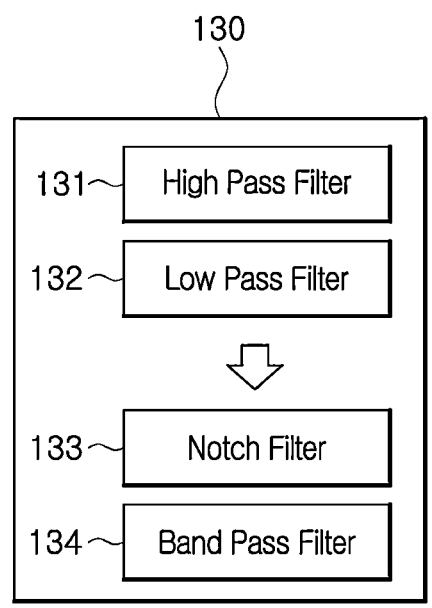
FIG. 3 is a view illustrating a configuration of a filter of the signal processing apparatus according to the embodiment of the present disclosure.

FIG. 3 is a block diagram illustrating a configuration of a filter of the signal processing apparatus of FIG. 1, according to an embodiment.

Referring briefly to FIG. 1, the signal input unit 120 receives the two signals having a phase difference and converts the two signals into digital signals. For example, the signal input unit 120 converts an inputted analog sensor signal HM1 into a digital signal SW1 by using the ADC, and provides the digital signal SW1 to the filter unit 130.

Referring now to FIG. 3, the filter unit 130 include a high pass filter 131 and a low pass filter 132, in the illustrated embodiment.

The filter unit 130 may connect the high pass filter 131 and the low pass filter 132 in series to constitute a band pass filter 134. Additionally or alternatively, the filter unit 130 may connect the high pass filter 131 and the low pass filter 132 in parallel to constitute a notch filter 133.

The filter unit 130 may filter a signal by using the notch filter 133 or the band pass filter 134 constituted by the high pass filter 131 and the low pass filter 132.

Therefore, the filter unit 130 may remove noise included in the signal by using the plurality of filters and may create a signal in a desired particular frequency region.

Figure 4:
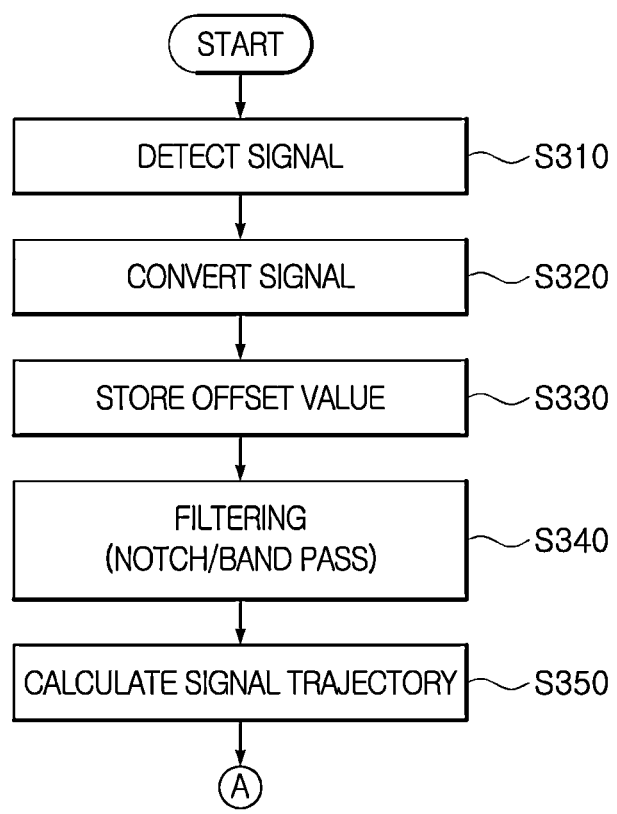
FIGS. 4 and 5 are flowcharts illustrating a method of operating the signal processing apparatus according to the embodiment of the present disclosure.
Figure 5:
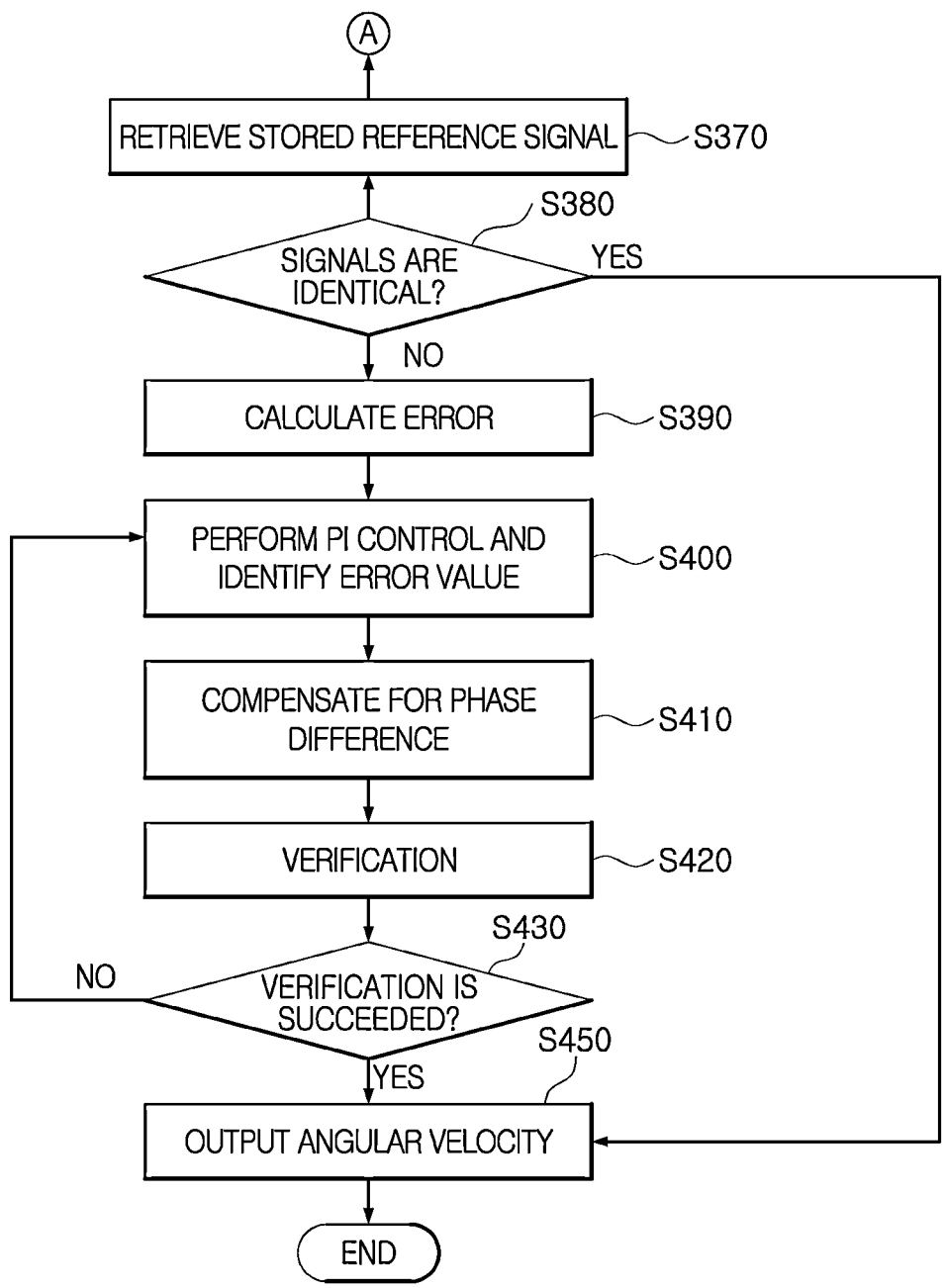

FIGS. 4 and 5 are flowcharts illustrating a method of operating the signal processing apparatus, according to an embodiment.

Referring to FIG. 4, the signal processing apparatus 30 may receive two signals, having a phase difference, detected by the sensor 10 (S310). The signal processing apparatus 30 may convert the two signals into digital signals by using the analog-to-digital converter of the signal input unit 120 (S320).

The control unit 110 may collect information on raw data generated by the analog-to-digital converter (ADC) of the signal input unit 120, identify an offset by determining a zero-cross point based on the converted signal, and store an offset value in the data unit 180 (S330).

The filter unit 130 may remove noise by filtering the two signals by using the band pass filter or the notch filter, and may separate a signal in a predetermined frequency region (S340).

In an example, the filter unit 130 configures the notch filter 133 or the band pass filter 134 by connecting the high pass filter 131 and the low pass filter 132 in parallel or in series and processes the signal.

The control unit 110 may create an absolute value of the filtered signal by applying the stored offset value, and may store the absolute value.

The pattern recognition unit 140 may create a signal trajectory having a predetermined shape based on the Lissajous figure by converting the two signals, which are filtered by the filter unit 130 and have a phase difference, into x-axis and y-axis coordinate values, respectively. The pattern recognition unit 140 may calculate a coordinate by setting a first filtered signal to an x-axis and setting a second filtered signal to a y-axis, and may recognize a trajectory of the signal, which is created by connecting the coordinates, based on the Lissajous figure.

The signal processing unit 150 may create a converted sensor signal by normalizing the signal trajectory to a predetermined size (S350).

In an example, the converted sensor signal is a signal generated by i) normalizing the trajectory of the signal created by digitizing and filtering the detected sensor signal and ii) converting the sensor signal into a vector dimension.

Referring now to FIG. 5, the signal processing unit 150 may retrieve a reference signal that is a stored signal (S370).

The signal processing unit 150 may retrieve a reference signal having a phase difference identical to a phase difference of the sensor signal.

In an example, the reference signal is a signal generated by normalizing the trajectory of the signal with respect to the signal having a predetermined phase difference in an idle state, and stored in the data unit 180. For example, the reference signal is a circular signal trajectory generated by synthesizing two signals having a phase difference of 90 degrees into a vector dimension.

The signal processing unit 150 may compare the converted sensor signal and the reference signal and may determine whether the signals are identical to each other (S380).

In an example, when the comparison result indicates that the reference signal and the converted sensor signal are equal to each other, the control unit 110 outputs an angular velocity based on the converted sensor signal (S450).

On the other hand, when the converted sensor signal is different from the reference signal, the signal processing unit 150 may calculate an error between the filtered signal and the reference signal. For example, the signal processing unit 150 calculates, as the error, a value made by subtracting the reference signal from the converted sensor signal.

The signal compensation unit 160 may reduce the error by repeatedly performing Proportional Integral (PI) control by applying the calculated error. The signal compensation unit 160 may thus perform phase difference compensation on the signal processed by the signal processing unit 150 (S410).

The control unit 110 may provide the compensated signal to the pattern recognition unit 140 and the signal processing unit 150.

The pattern recognition unit 140 and the signal processing unit 150 may use the Lissajous figure and verify whether the compensation has been normally performed (S420). The signal processing unit 150 may normalize the trajectory of the signal created by the pattern recognition unit 140 based on the compensated signal, and may calculate an error by comparing the compensated signal with the reference signal. In an example, when the error is 0, the control unit 110 determines that the compensated signal is normal and completes the verification.

When the verification result indicates that the compensation has not been normally performed (S430), the control unit 110 may repeatedly perform the process of calculating the error, reducing the error by performing the PI control, and compensating for the phase difference (S400, S410, and S420).

When the verification is normally completed, the control unit 110 may calculate an angular velocity based on the compensated signal and may output the angular velocity (S450).

Therefore, embodiments of the present disclosure compensate for an error between two signals having a phase difference and calculate an angular velocity by compensating for the phase difference.

Figure 6A:
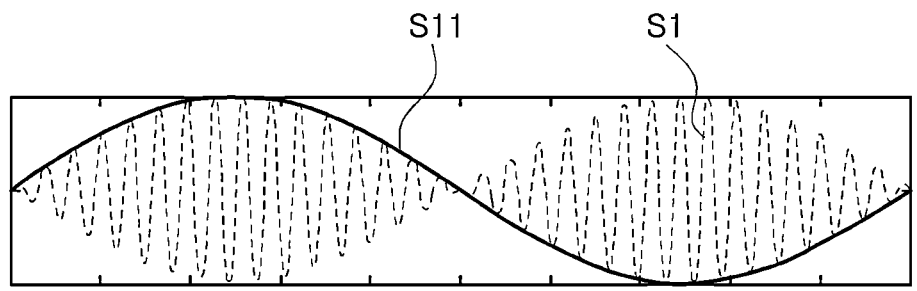
FIGS. 6A and 6B are views for explaining an operation of the filter of the signal processing apparatus according to the embodiment of the present disclosure.
Figure 6B:
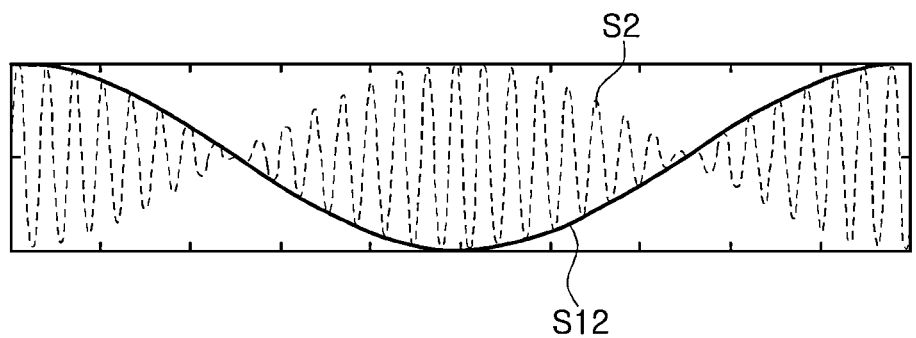
Figure 7:
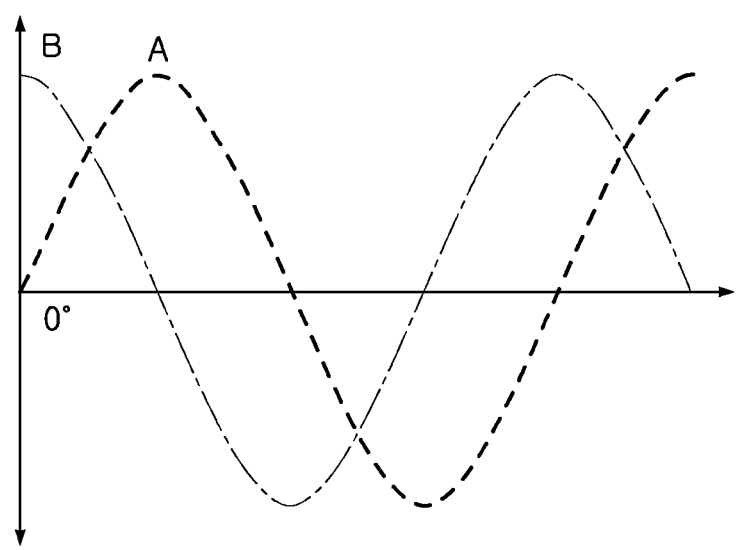
FIG. 7 is a view illustrating a filtered signal in FIG. 6.

FIGS. 6A-B illustrate plots for explaining operation of the filter of the signal processing apparatus of FIG. 1, according to an embodiment. FIG. 7 is a plot illustrating a filtered signal in FIGS. 6A and 6B.

Referring to FIGS. 6A and 6B, the signal input unit 120 may detect a first sensor signal S1 and a second sensor signal S2 from the sensor 10. In an example, the first and second sensor signals S1 and S2 are sensor signals generated by synthesizing frequencies and have a phase difference with a predetermined magnitude.

The signal input unit 120 may convert the first and second sensor signals S1 and S2, which are inputted from the sensor 10, into digital signals by using the analog-to-digital converter (ADC).

The filter unit 130 may remove noise by filtering the digitized first and second sensor signals S1 and S2 and may output first and second signals S11 and S12 filtered in a particular frequency band. In an example, the filter unit 130 outputs the first signal S11 by filtering the first sensor signal S1 and outputs the second signal S12 by filtering the second sensor signal S2.

The filter unit 130 may filter the first and second sensor signals S1 and S2 by using the band pass filter 134. The band pass filter may be used because the operating performance of a general low pass filter may be affected by a delay caused by characteristics of an integrator when the general low pass filter is used.

Referring now to FIG. 7, the signal filtered by the filter unit 130, i.e., the first and second signal S11 (A) and S12 (B), have phase differences having predetermined magnitudes. For example, the first signal S11 (A) and the second signal S12 (B) have a phase difference of 90 degrees.

The control unit 110 may calculate an average, for one cycle, of the first and second signals S11 (A) and S12 (B) and may perform absolutization by providing an offset at a zero-cross point by computing an average value. The control unit 110 may compensate for a negative value by performing absolutization on the offset according to the average value computation and zero-crossing.

The control unit 110 may calculate an angular velocity for controlling the motor by using the filtered signal, i.e., the first and second signals S11 (A) and S12 (B).

The control unit 110 may identify whether the sensor signal inputted from the sensor 10 is normal, before calculating the angular velocity. When the sensor signal inputted from the sensor 10 is abnormal, the control unit 110 may compensate for the abnormality and then calculate the angular velocity.

The control unit 110 may allow the pattern recognition unit 140 and the signal processing unit 150 to identify whether the signal is abnormal and may allow the signal compensation unit 160 to compensate for the error caused by the abnormality. In addition, the control unit 110 may provide the compensated signal to the pattern recognition unit 140 and the signal processing unit 150 to verify the compensated signal, and may calculates the angular velocity based on the compensated signal.

Figure 8A:
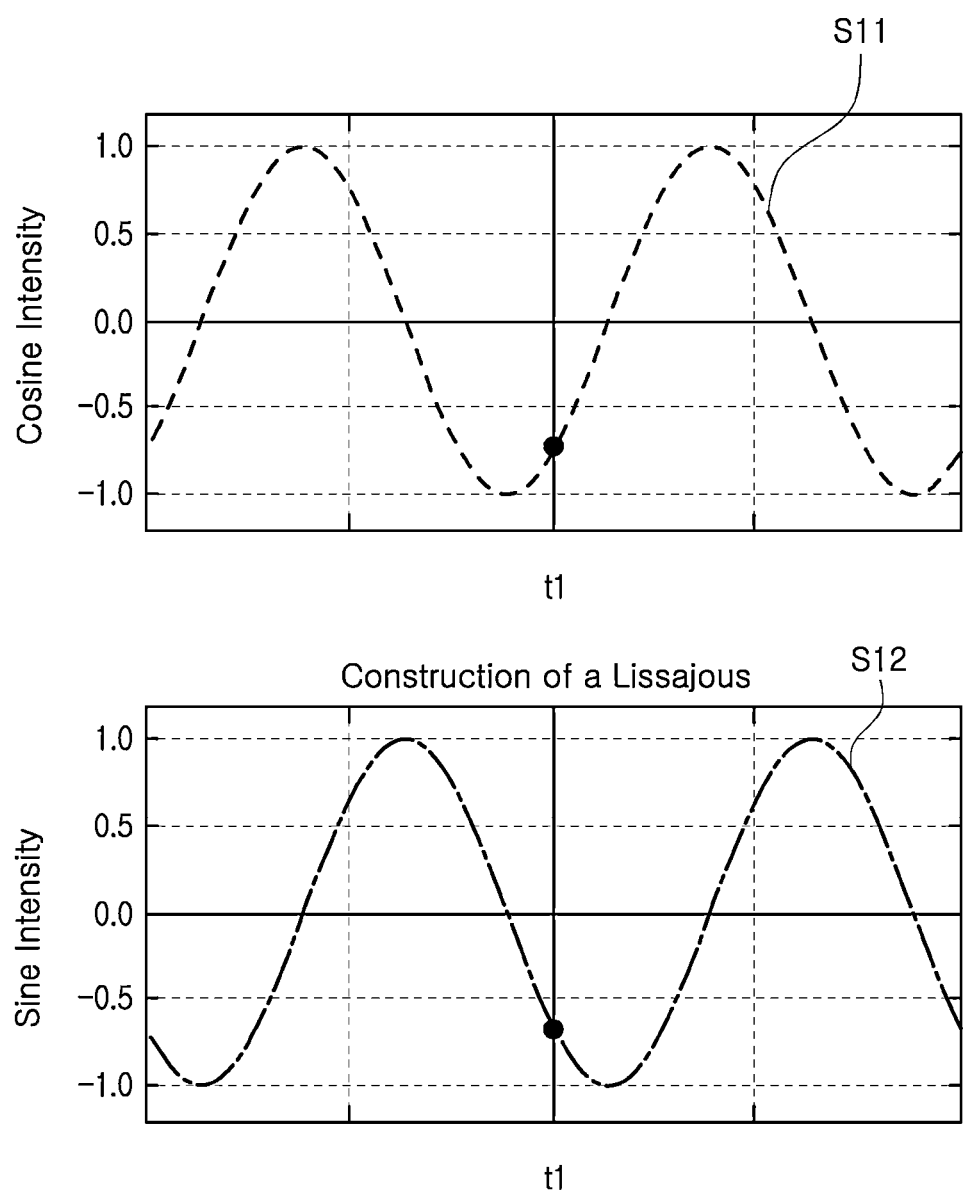
FIGS. 8A, 8B and 8C are views for explaining a method of generating the Lissajous figure of the signal processing apparatus according to the embodiment of the present disclosure.
Figure 8B:
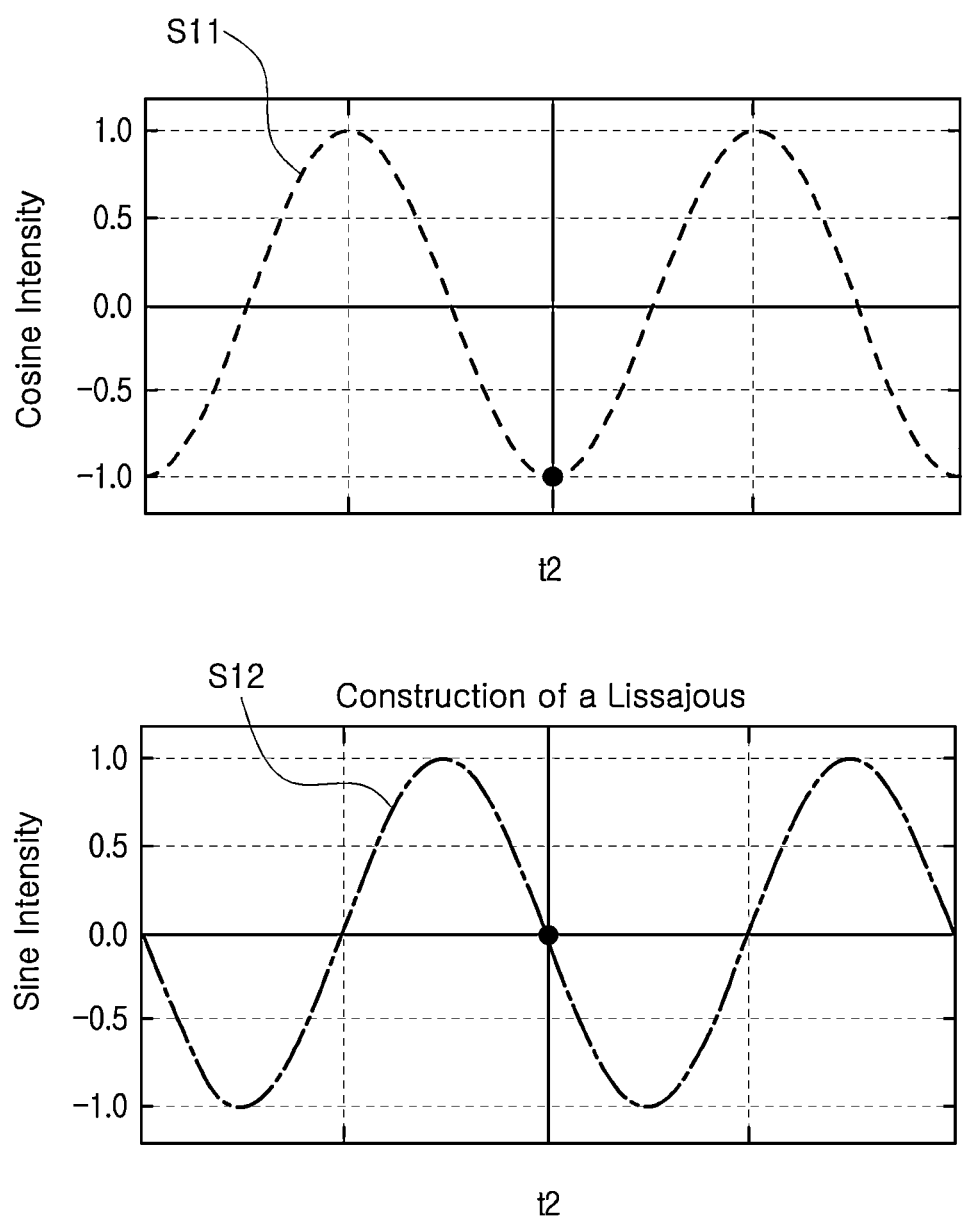
Figure 8C:
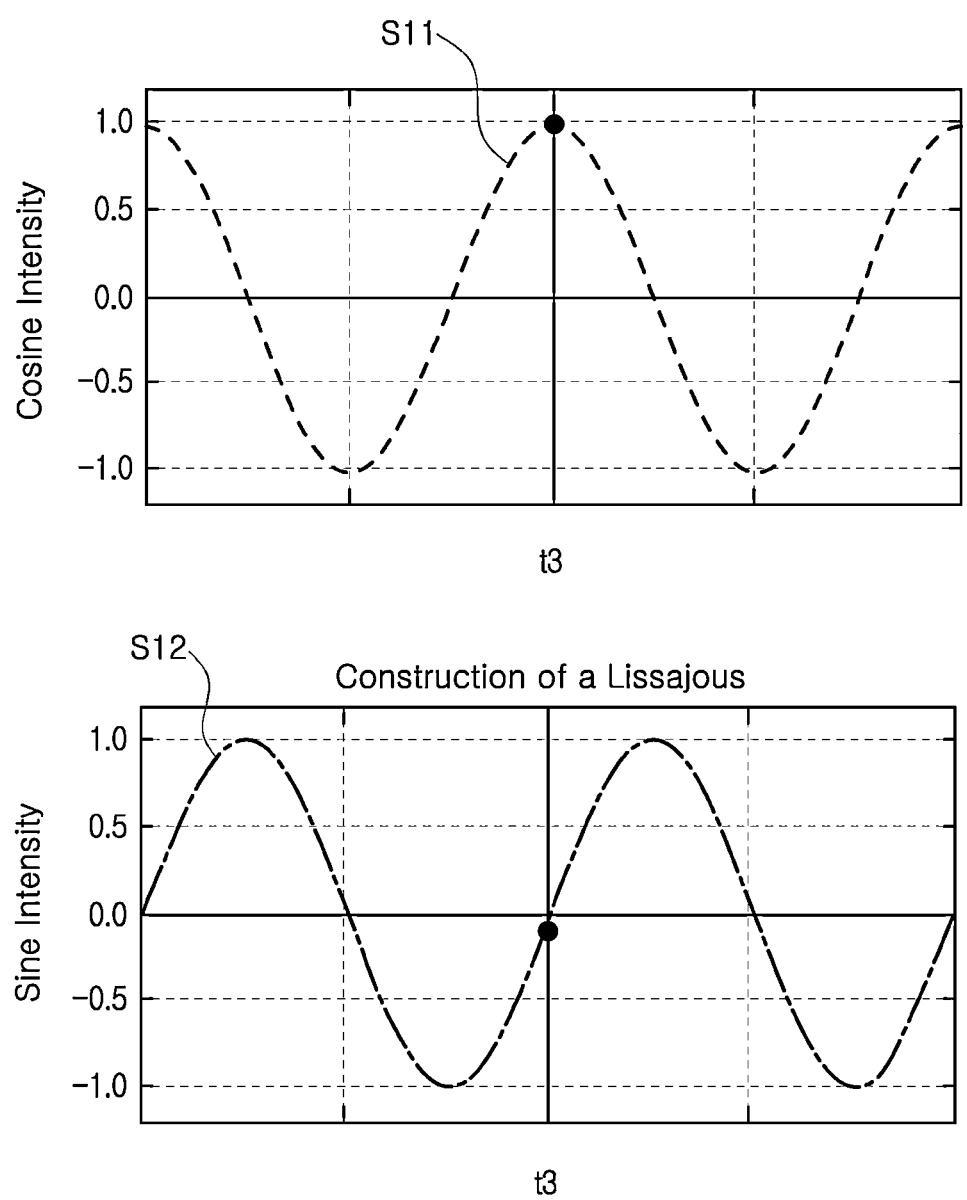

FIGS. 8A-8C illustrated plots for explaining a method for creating the Lissajous figure by the signal processing apparatus of FIG. 1, according to an embodiment. FIG. 9 is a plot illustrating the Lissajous figure created from the signal in FIGS. 8A-8C.

Referring to FIGS. 8A and 8B, the pattern recognition unit 140 may convert signal values of the first and second signals S11 and S12 having a phase difference into X-axis and Y-axis coordinate vector values over time.

With reference to FIG. 8A, the pattern recognition unit 140 may convert the signal value of the first signal S11 corresponding to a first time t1 into the x-axis coordinate value and convert the signal value of the second signal S12 corresponding to the first time t1 into the y-axis coordinate value.

Figure 9A:
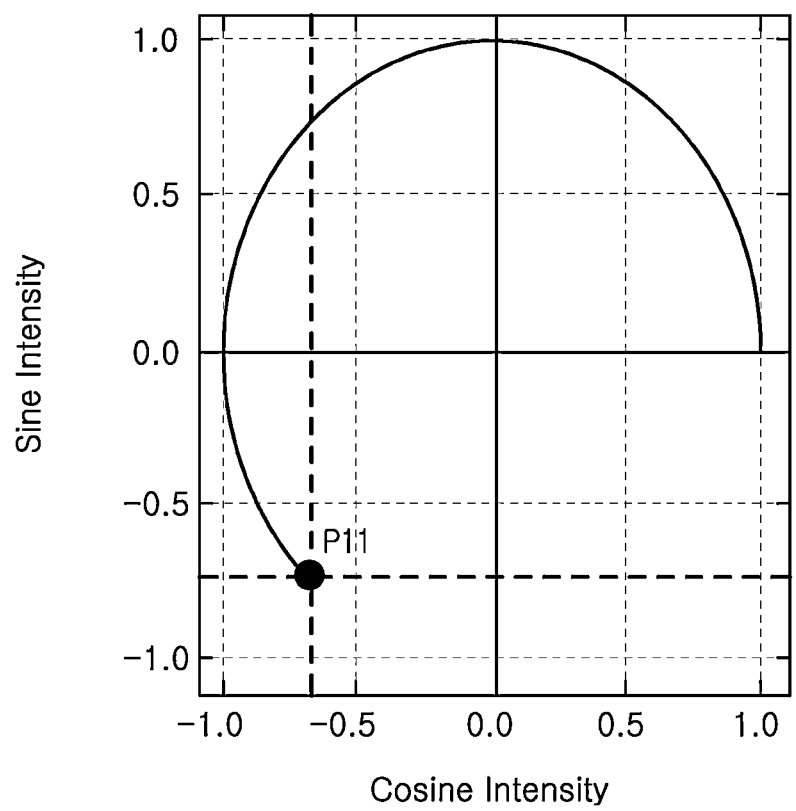
FIGS. 9A, 9B and 9C are views illustrating the Lissajous figures detected from a signal in FIG. 8.

Therefore, as illustrated in FIG. 9A, the first and second signals S11 and S12 values corresponding to the first time t1 are converted into a first point P11.

Referring now to FIG. 8B, the pattern recognition unit 140 may convert the signal value of the first signal S11 corresponding to a second time t2 into the x-axis coordinate value and converts the signal value of the second signal S12 corresponding to the second time t2 into the y-axis coordinate value.

Figure 9B:
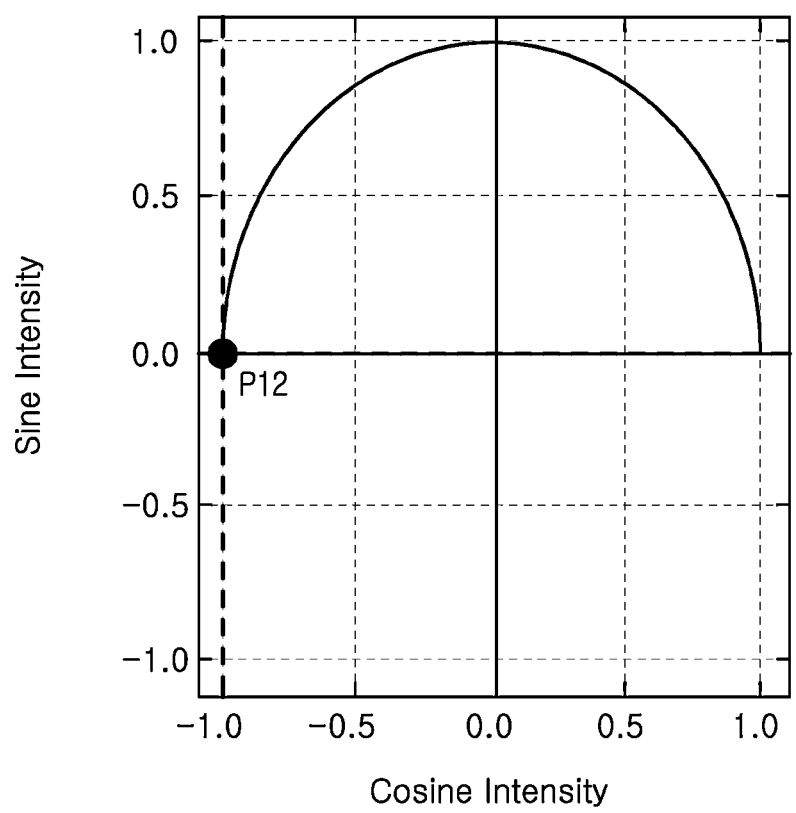

Therefore, as illustrated in FIG. 9B, the first and second signals S11 and S12 values corresponding to the second time t2 are converted into a second point P12.

In addition, referring to FIG. 8C, the pattern recognition unit 140 may convert the signal value of the first signal S11 corresponding to a third time t3 into the x-axis coordinate value and converts the signal value of the second signal S12 corresponding to the third time t3 into the y-axis coordinate value.

Figure 9C:
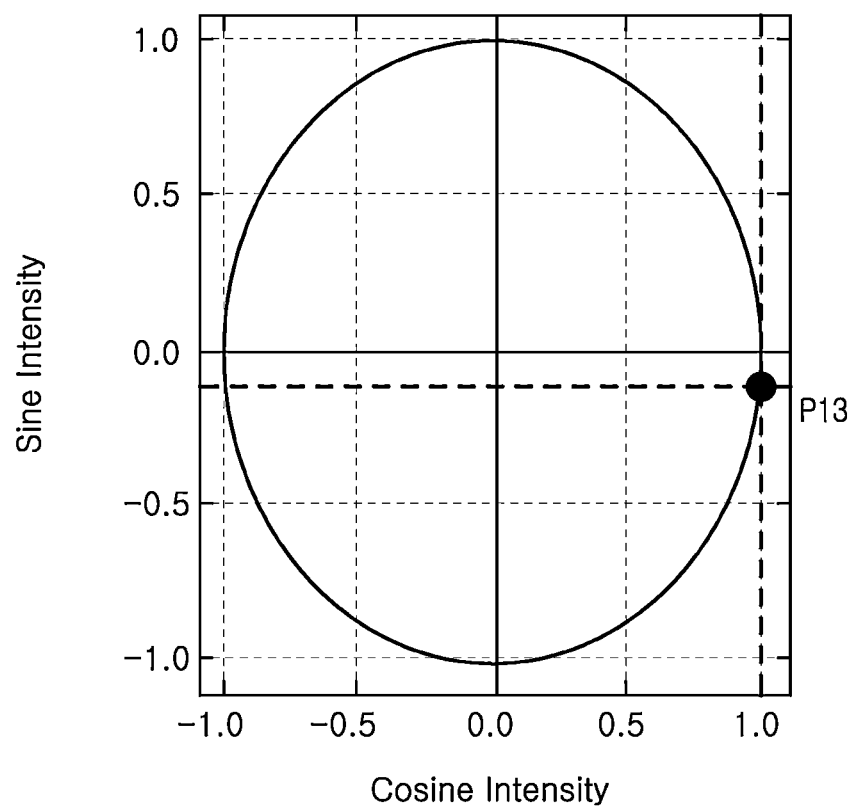

Therefore, as illustrated in FIG. 9C, the first and second signals S11 and S12 values corresponding to the third time t3 are converted into a third point P13.

Therefore, the pattern recognition unit 140 may accumulate coordinate values over time by converting the first and second signals S11 and S12 having a phase difference and may create the signal trajectory that has a predetermined shape by connecting the coordinate values. The pattern recognition unit 140 recognizes a shape of the signal trajectory as a pattern. The trajectory of the created signal is based on the Lissajous figure.

In case that a ratio between magnitudes of the first and second signals S11 and S12 is 1:1 and a phase difference therebetween is 90 degrees, a circular signal trajectory is created, as illustrated in FIG. 9C. When the phase difference between the signals S11 and S12 deviates from 90 degrees or the magnitude of the signal changes, the pattern recognition unit 140 may create a signal trajectory having an elliptical or butterfly shape and may recognize the signal trajectory as a pattern.

Therefore, when the pattern recognition unit 140 recognizes the circular signal pattern based on the created signal trajectory, the pattern recognition unit 140 may recognize that the ratio between signal magnitudes of the two signals S11 and S12 is 1:1, and the phase difference therebetween is 90 degrees.

Figure 10:
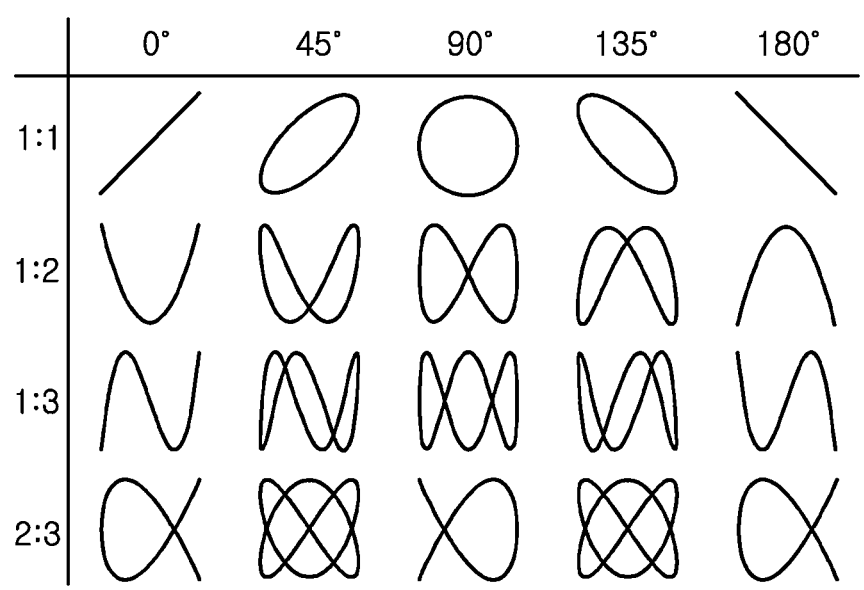
FIG. 10 is an exemplified view illustrating the Lissajous figures according to phase differences and ratios between magnitudes of signals.

FIG. 10 illustrates example Lissajous figures according to phase differences and ratios between magnitudes of signals.

As illustrated in FIG. 10, the Lissajous figure creates trajectories having different shapes according to the ratio between magnitudes of the two signals even though the phase differences are identical.

For example, in the case that the phase difference between the filtered signals, e.g., the first and second signals S11 and S12, is 0, a signal trajectory having a straight line shape is created when the ratio between magnitudes of the first and second signals S11 and S12 is 1:1, a trajectory having a parabolic shape is created when the ratio between magnitudes of the first and second signals S11 and S12 is 1:2, a signal trajectory having a wave shape is created when the ratio between magnitudes of the first and second signals S11 and S12 is 1:3, and a signal trajectory having an alpha shape is created when the ratio between magnitudes of the first and second signals S11 and S12 is 2:3.

In the case that the phase difference between the first and second signals S11 and S12 is 45 degrees, a signal trajectory having an elliptical shape is created when the ratio between magnitudes of the first and second signals S11 and S12 is 1:1, and a signal trajectory having a butterfly shape that is horizontally asymmetric and vertically symmetric is created when the ratio between magnitudes of the first and second signals S11 and S12 is 1:2.

In the case that the phase difference between the first and second signals S11 and S12 is 90 degrees, a signal trajectory having a circular shape is created when the ratio between magnitudes of the first and second signals S11 and S12 is 1:1, and a signal trajectory having a horizontally and vertically symmetric butterfly shape is created when the ratio between magnitudes of the first and second signals S11 and S12 is 1:2.

In the case that the phase difference between the first and second signals S11 and S12 is 135 degrees, signal trajectories which have the basic shapes for the respective ratios between signal magnitudes identical to those in the case that the phase difference therebetween is 45 degrees, but are vertically inverted, are created. In the case that the phase difference between the first and second signals S11 and S12 is 180 degrees, signal trajectories which have the basic shapes for the respective ratios between signal magnitudes identical to those in the case that the phase difference therebetween is 0 degree, but are vertically inverted, are created.

In an example, because the trajectories change depending on the magnitudes of the signals even though the phase differences are identical to one another, the signal processing unit 150 normalizes the magnitudes of the signals so that the ratio between signal magnitudes of the first and second signals S11 and S12 is 1:1. The signal processing unit 150 may change the ratio between the magnitudes of the signals to a desired ratio by using a normalization module (not illustrated). For example, the signal processing unit 150 may perform normalization so that the magnitude of the signal is 1.

The signal processing unit 150 may create a converted sensor signal (third signal) by normalizing the trajectory of the signal created by the pattern recognition unit 140.

The signal processing unit 150 may normalize the signal based on the trajectory of the signal created on the principle of the Lissajous figure, thereby excluding a change in signal trajectory according to the magnitude of the signal and calculating a change in shape caused by the phase difference.

The signal processing unit 150 may store the data in the form of an arrangement table, identify the trajectories (e.g., circles) of the signals made by synthesizing the two signals (first and second signals S1 and S2), which are actually measured and processed, and identify the errors between the trajectories. In this case, the error is not a phase difference between the first signal and second signal, but is an error associated with whether a current phase difference between the first signal and second signal having a phase difference is normal.

Therefore, embodiments of the present disclosure may improve efficiency of detecting an error according to a phase difference by excluding a magnitude of the signal and emphasizing a part associated with the phase difference.

Figure 11A:
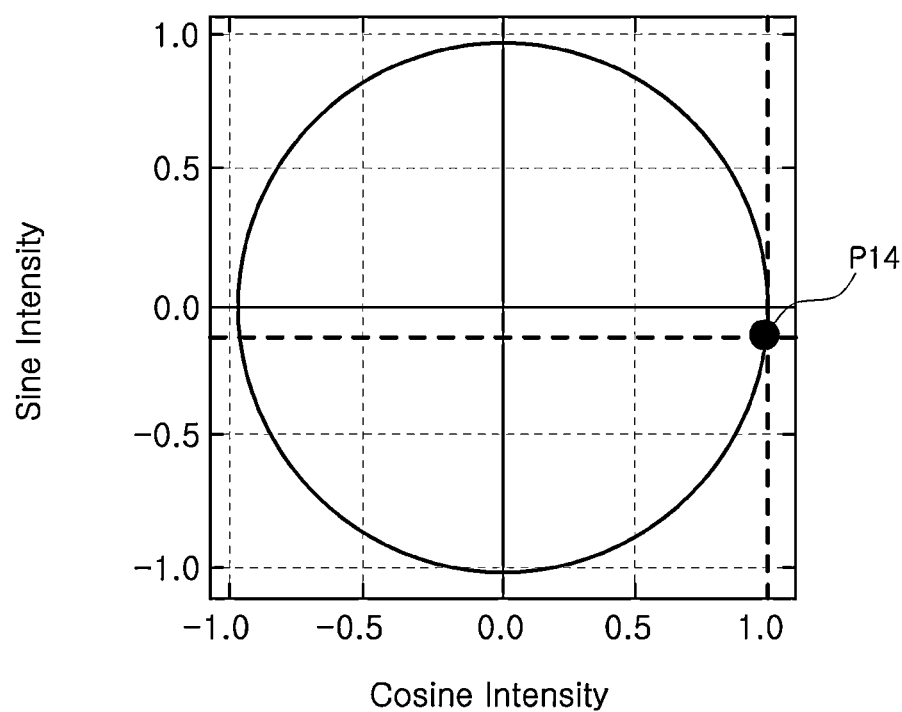
FIGS. 11A and 11B are views for explaining the detection of abnormality based on the Lissajous figures of the signal processing apparatus according to the embodiment of the present disclosure.
Figure 11B:
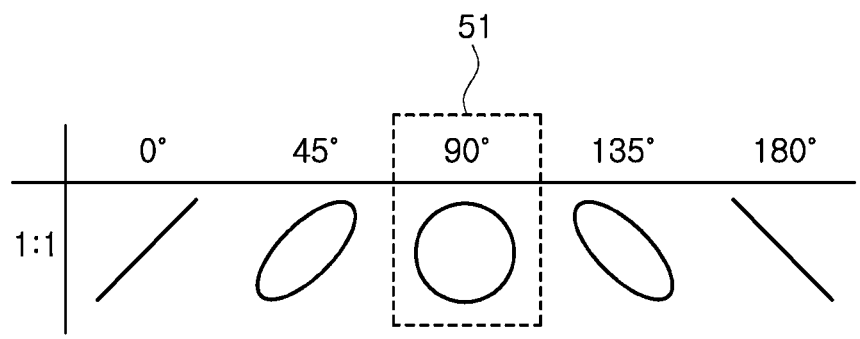

FIGS. 11A-11B illustrate plots for explaining the detection of abnormality based on the Lissajous figures performed by the signal processing apparatus of FIG. 1, according to an embodiment.

Referring to FIG. 11A, the pattern recognition unit 140 may create the trajectory (circle) of the signal by converting the two filtered and processed signals, the first and second signals S11 (A) and S12 (B).

The signal processing unit 150 may normalize the trajectory of the created signal. For example, the signal processing unit 150 normalizes the signal and thus excludes the change in signal according to the magnitude of the signal from the trajectory of the signal created by the pattern recognition unit 140 and leaves only the change in signal according to the phase difference.

The signal processing unit 150 may detect an error by comparing the trajectory of the detected signal, as the converted sensor signal (third signal), with the reference signal. The reference signal is an Lissajous figure signal that has a predetermined shape and is created from the two reference signals having a phase difference identical to the phase difference between the two inputted sensor signals S1 and S2.

When the phase difference between the two sensor signals S1 and S2 inputted by the signal input unit 120 is 90 degrees, the signal processing unit 150 may retrieve the reference signals having a phase difference of 90 degrees. When the phase difference between the two inputted sensor signals is 45 degrees, the signal processing unit 150 retrieves the reference signals having a phase difference of 45 degrees.

The signal processing unit 150 may calculate an error by comparing i) the signal trajectory in FIG. 11A created from the first signal and the second signal, i.e., the converted sensor signal (third signal) with ii) a trajectory 51 of the signal in FIG. 11B, i.e., the reference signal. That is, the signal processing unit 150 may compare the converted sensor signal, which is created from the filtered first and second signals, with the reference signal having the same phase difference, and may calculate an error from an arch thereof.

When the converted sensor signal (third signal) is identical to the reference signal, the signal processing unit 150 may determine that the phase differences are identical to each other, and the error is 0.

When the converted sensor signal (third signal) is different from the reference signal, the signal processing unit 150 may calculate an error from a difference therebetween.

The signal compensation unit 160 may compensate for the error between the filtered signals, i.e., the first signal S11 and the second signal S12, based on the error between the converted sensor signal and the reference signal.

When the error calculated by the signal processing unit 150 is not 0, the signal compensation unit 160 may determine that the phase difference between the first signal S11 and the second signal S12 is abnormal, and may compensate for the error between the two signals based on the calculated error.

Therefore, the signal compensation unit 160 may compensate for the phase difference between the two signals, i.e., the first signal S11 and the second signals S12.

For example, when the error between the first signal S11 and the second signal S12 having a phase difference of 90 degrees, which is calculated by the signal processing unit 150, is not 0, an actual phase difference is not 90 degrees. Therefore, the signal compensation unit 160 may compensate for the signal by the error.

The signal compensation unit 160 may compensate for the error of the signal by performing PI control based on the calculated error. In an example, the signal compensation unit 160 performs the PI control and thus additionally compensates for a value normalized by using feed forward.

In examples, the signal compensation unit 160 may more easily and quickly compensate for the phase difference by using the calculated error between the two signals. The signal compensation unit 160 outputs the compensated sensor signal (a fifth signal and a sixth signal).

When the error calculated by the signal processing unit 150 is 0, the converted sensor signal (third signal) and the reference signal are identical to each other. Therefore, the control unit 110 may determine that the filtered signals, i.e., the first and second signals S11 and S12, are normal signals.

When the first and second signals S11 and S12 are normal signals, the control unit 110 may calculate an angular velocity based on the first and second signals S11 and S12 without performing separate compensation and verification.

On the other hand, when the error calculated by the signal processing unit 150 is not 0, the control unit 110 may determine that the first and second signals S11 and S12 are abnormal.

When the signals are abnormal, the control unit 110 may allow the signal compensation unit 160 to compensate for the error.

The control unit 110 may verify whether the signals are normally compensated, by providing the compensated sensor signals (the fifth signal and the sixth signal), which are outputted from the signal compensation unit 160, to the pattern recognition unit 140 and the signal processing unit 150.

When verification is completed, the control unit 110 may calculate an angular velocity based on the compensated sensor signals (the fifth signal and the sixth signal).

Therefore, embodiments of the present disclosure may control the motor by detecting the abnormality of the sensor signal using the Lissajous figure and by easily and quickly detecting the phase difference.

While the present disclosure has been described with reference to the embodiment illustrated in the drawings, the embodiment is only for illustrative purpose, and those skilled in the art to which the present technology pertains will understand that various modifications of the embodiment and any other embodiment equivalent thereto are available. Accordingly, the true technical protection scope of the present disclosure should be determined by the appended claims.

What is claimed is:

1. A signal processing apparatus comprising:
    a signal input unit configured to receive and digitize two signals having a phase difference;
    a filter unit configured to filter the two digitized signals and output filtered first and second signals;
    a pattern recognition unit configured to convert the filtered first and second signals into coordinates and create a signal trajectory having a predetermined shape;
    a signal processing unit configured to create a converted sensor signal by normalizing the signal trajectory, calculate an error by comparing the converted sensor signal and a reference signal, and detect abnormality of the filtered first and second signals;
    a signal compensation unit configured to compensate the filtered first and second signals based on the error between the converted sensor signal and the reference signal when abnormality is detected; and
    a control unit configured to verify whether the filtered first and second signals are normally compensated, by providing the filtered first and second signals, compensated by the signal compensation unit, to the pattern recognition unit and the signal processing unit, the control unit being configured to calculate an angular velocity based on the compensated first and second signals and a verification result.

2. The signal processing apparatus of claim 1, wherein the filter unit comprises a high pass filter and a low pass filter, wherein the high pass filter and the low pass filter are connected in series or in parallel to constitute a notch filter or a band pass filter, and wherein the filter unit is configured to remove noise of each of the two digitized signals, and separate each of the two digitized signals in a particular frequency region.

3. The signal processing apparatus of claim 1, wherein the signal processing unit is configured to:
  retrieve, from a memory, a reference signal having a phase difference identical to the phase difference between the filtered first and second signals, and
  compare the reference signal with the filtered first and second signals.

4. The signal processing apparatus of claim 1, wherein the signal processing unit is configured to normalize the signal trajectory, created by the pattern recognition unit, so that a ratio between signal magnitudes of the filtered first and second signals is 1:1.

5. The signal processing apparatus of claim 1, wherein the signal processing unit is configured to:
  perform normalization to exclude a change caused by signal magnitudes of the filtered first and second signals, and
  compare a change caused by the phase difference.

6. The signal processing apparatus of claim 1, wherein the signal processing unit is configured to:
  determine that the first and second signals are normal when a result of comparing the reference signal and the converted sensor signal indicates that the error between the reference signal and the converted sensor signal is 0, and
  determine that the first and second signals are abnormal when the result of comparing the reference signal and the converted sensor signal indicates that the error between the reference signal and the converted sensor signal is not 0.

7. The signal processing apparatus of claim 1, wherein the pattern recognition unit is configured to:
  convert a signal value of the first signal into an X-axis coordinate,
  convert a signal value of the second signal into a Y-axis coordinate, and
  create the signal trajectory that connects the X-axis coordinate and the Y-axis coordinate.

8. The signal processing apparatus of claim 1, wherein the pattern recognition unit is configured to:
  create the signal trajectory based on a Lissajous figure, and
  recognize the signal trajectory as a pattern.

9. The signal processing apparatus of claim 1, wherein:
  the pattern recognition unit is configured to, when the compensated first and second signals are inputted, create a signal trajectory from the compensated first and second signals, and
  the signal processing unit is configured to verify the compensated first and second signals by calculating an error by comparing the signal trajectory, created based on the compensated first and second signals, with the reference signal.

10. The signal processing apparatus of claim 1, wherein the control unit is configured to:
  when the error is 0, calculate the angular velocity based on the filtered first and second signals without verifying the filtered first and second signals, and
  when the error is not 0, allow the signal compensation unit to compensate for the error.

* * * * *